United States Patent
Zanardi et al.

(10) Patent No.: US 7,567,456 B2
(45) Date of Patent: Jul. 28, 2009

(54) PAGE BUFFER CIRCUIT AND METHOD FOR A PROGRAMMABLE MEMORY DEVICE

(76) Inventors: Stefano Zanardi, Via Carducci, 4, I-24068 Seriate (BG) (IT); Giulio Martinozzi, Via Fratti, 2/A, I-58024 Massa Marittima (GR) (IT)

(*) Notice: Subject to any disclaimer, the term of this patent is extended or adjusted under 35 U.S.C. 154(b) by 382 days.

(21) Appl. No.: 11/166,354

(22) Filed: Jun. 24, 2005

(65) Prior Publication Data

US 2006/0007774 A1   Jan. 12, 2006

(30) Foreign Application Priority Data

Jun. 24, 2004  (EP) ................... 04102942

(51) Int. Cl.
*G11C 11/34* (2006.01)
*G11C 16/04* (2006.01)
*G11C 7/10* (2006.01)

(52) U.S. Cl. .................... 365/185.05; 365/189.03; 365/189.17; 365/189.05

(58) Field of Classification Search ............ 365/185.05, 365/185.12, 189.05
See application file for complete search history.

(56) References Cited

U.S. PATENT DOCUMENTS

| | | | | |
|---|---|---|---|---|
| 5,748,529 A * | 5/1998 | Lee | | 365/185.17 |
| 5,768,215 A * | 6/1998 | Kwon et al. | | 365/238.5 |
| 7,298,650 B2 * | 11/2007 | Khouri et al. | | 365/185.12 |
| 2002/0071311 A1 * | 6/2002 | Jeong et al. | | 365/185.12 |
| 2002/0186591 A1 * | 12/2002 | Lee et al. | | 365/185.17 |
| 2003/0076719 A1 | 4/2003 | Byeon et al. | | |
| 2003/0117856 A1 * | 6/2003 | Lee et al. | | 365/189.05 |
| 2003/0210576 A1 * | 11/2003 | Hwang et al. | | 365/189.05 |
| 2005/0030790 A1 * | 2/2005 | Jeong et al. | | 365/185.03 |
| 2005/0157560 A1 * | 7/2005 | Hosono et al. | | 365/185.22 |
| 2005/0172086 A1 * | 8/2005 | Kawai | | 711/154 |
| 2005/0254320 A1 * | 11/2005 | Kim | | 365/200 |
| 2006/0013045 A1 * | 1/2006 | Lee | | 365/189.05 |
| 2006/0215482 A1 * | 9/2006 | Lee | | 365/235 |

OTHER PUBLICATIONS

European Search Report, EP 04102942, May 2, 2005.
Seungjae Lee, et al., 2.7 A 3.3V 4Gb Four-Level NAND Flash Memory with 90nm CMOS Technology, 2004 IEEE International Solid-State Circuits Conference, 2004.

* cited by examiner

*Primary Examiner*—Ly D Pham
(74) *Attorney, Agent, or Firm*—Blakely, Sokoloff, Taylor & Zafman LLP

(57) ABSTRACT

A page buffer for an electrically programmable memory includes a plurality of storage units, each comprising a first latch and a second latch. Input switching means loads into the latch the data bit to be written and to be temporarily stored. The input switching means has an input terminal connected to the respective data line for receiving a set voltage provided therethrough. The input switching means provides the set voltage to the first or second input/output terminals of the latch depending on the data bit to be written. An output switch device transfers onto the respective data line the read data bit temporarily stored into the latch and has a first terminal coupled to one among the first and second input/output terminals of the latch, a second terminal connected to the respective data line and a control terminal receiving the output control signal.

23 Claims, 2 Drawing Sheets

US 7,567,456 B2

PAGE BUFFER CIRCUIT AND METHOD FOR A PROGRAMMABLE MEMORY DEVICE

PRIORITY CLAIM

This application claims priority from European patent application No. 04102942.2, filed Jun. 24, 2005, which is incorporated herein by reference.

TECHNICAL FIELD

The present invention generally relates to the field of solid-state memories, particularly to semiconductor memories and, even more particularly, to the field of non-volatile memories. Specifically, the invention relates to non-volatile memories that are electrically programmable.

BACKGROUND

Non-volatile memories are commonly used in several applications when the data stored in the memory device need to be preserved even in absence of a power supply. Within the class of non-volatile memories, electrically programmable (and erasable) memories, such as flash memories, have become very popular in applications in which the data to be stored are not immutable (as it might be in the case of, e.g., a consolidated code for a microprocessor), being instead necessary from time to time to store new data, or to update the data already stored.

Typically, the memory device includes an arrangement of memory cells, disposed for example in rows and columns, so as to form a matrix.

Depending on the way the memory cells in the matrix are interconnected, two classes of flash memories can be identified: those having a so-called NOR architecture, or NOR flash memories, and those having a so-called NAND architecture, shortly referred to as NAND flash memories. Roughly speaking, in a NOR architecture the memory cells of a same matrix column are connected in parallel to a same bit line, whereas in a NAND architecture groups of memory cells of a same matrix column are serially interconnected so as to form respective strings, which strings are then connected in parallel to each other to a same bit line.

Compared to NOR flash memories, NAND flash memories are more compact (a lower number of contacts in the matrix are required), and they are also better suited for applications such as file storage.

In the NAND architecture, the memory space is ideally partitioned into a plurality of memory pages, each page corresponding to a block of memory cells that, in operation, are read or written simultaneously, i.e. in parallel to each other. The number of memory cells in each block determines the size (i.e., the number of bits) of the memory page. Nowadays, memory pages of 512 Bytes are rather typical, but larger memory pages are also encountered, for example of 2 KBytes.

Clearly, the memory cannot have so high a number of Input/Output (I/O) terminals as to enable transferring in parallel such long data words; usually, eight or sixteen I/O terminals are in fact provided; thus, some kind of "segmentation" of the memory page is necessary for interfacing the memory with the outside world.

To this purpose, a circuit arrangement called a "page buffer" is provided in the memory for managing the operations of reading the information stored in the memory cells of a selected memory page, or writing new information thereinto. In very general terms, the page buffer includes a buffer register of size equal to that of the memory page, wherein data read (in parallel) from the memory cells of a selected page are temporarily stored, before being serially outputted in chunks of, e.g., eight or sixteen bits, depending on the number of I/O terminals of the memory; similarly, when data are to be written into the memory, the page buffer is replenished with data received serially in said eight- or sixteen-bits chunks, and, when the buffer has eventually been filled, the data are written in parallel into the memory cells of a given, selected memory page.

The page buffer includes a relatively high number of volatile storage elements, typically bistable elements or latches; the number of latches is proportional (in particular, equal) to the size (in number of bits) of the memory page; thus, the page buffer is a circuit block that needs to be carefully designed (both at the circuit and at the physical layout level), so as to ensure that it does not occupy too large a semiconductor area, and it is efficient, particularly from the power consumption viewpoint.

If the operations to be performed on the memory cells are simply a "PAGE READ" (an operation involving reading data from a selected memory page) and a page write or "PAGE PROGRAM" (writing data into a selected memory page), the page buffer may in principle include a single register, with a number of latches equal to the size (in bits) of the memory pages. However, more complex operations may be desirable and required, and in these cases the structure of the page buffer may need to be upgraded. For example, in some applications it might be necessary that the memory is capable of performing operations such as a "COPY-BACK PROGRAM" and a "CACHE PROGRAM". In a CACHE PROGRAM operation, data to be written into a memory page can be loaded into the page buffer while another memory page is still being written with data loaded in the page buffer at a previous time; in this way, the time necessary for programming in sequence different memory pages is reduced. A COPY-BACK PROGRAM operation is instead exploited for copying the data contained in a given memory page into another memory page, in a way managed completely internally to the memory, without the necessity of outputting the data. A page buffer adapted to implement these two additional operations needs to include a pair of buffer registers (and thus two arrays of latches), that can be coupled to two selectable packets of bit lines of the matrix.

Typically, the page buffer includes two registers, a main register and a cache register, each one controlled by respective control signals and having different functions. In detail, the cache register is not used in the PAGE READ operation (which is performed using only the main register) and is not adapted to perform writing operations; the cache register is exploited for loading data to be programmed into, or read from, selected memory cells. On the contrary, the main register is adapted to program selected memory cells; the main register receives the data from the cache register and, then, performs the required writing operation. In the CACHE PROGRAM operation such a structure permits to program a first memory page by means of the main register while the data to be written into a second memory page are loaded into the cache register, thus speeding up the operation. In the COPY-BACK PROGRAM operation data are loaded from a given page into the cache register, transferred from the cache register into the main register and then programmed in another page by the main register.

However, a phase of data transfer from the cache register into the main register is necessary, and an increasing request for faster NAND memories has brought to devise solutions for further speeding up the operations to be performed.

For example, U.S. Published Patent Application No. 2003/0076719 discloses a page buffer including two sense and latch blocks, which exclusively carry out the same function. While one of the sense and latch blocks carries out a read operation, the other sense and latch block outputs previously sensed data to the exterior. Further, while one of the sense and latch blocks carries out a program operation, the other sense and latch block loads data to be programmed. In detail, the two sense and latch blocks include a latch, a transfer circuit for reading operation and a transfer circuit for programming operation, respectively. The reading transfer circuit is adapted to load a data bit, read from the selected memory cell or received from the I/O terminals of the memory, into the latch and to output the read data bit towards the I/O terminals of the memory. The programming transfer circuit is adapted to program the selected memory cell accordingly to the received data bit.

The latch included in the two registers of the page buffer must be reset before a reading operation. A reset of the latches in the two sense and latch blocks is described in U.S. Published Patent Application No. 2003/0076719 and is obtained by exploiting a precharge circuit and a three-transistor path included in the reading transfer circuit and controlled by three corresponding control signals. Furthermore, a data loading and a data outputting performed by the reading transfer circuit require a two-transistor path controlled by two corresponding control signals.

The Applicant observes that the control of the reset of the latch and of the data loading and outputting is critical, since it depends on a plurality of control signals corresponding to a respective multitude of transistors. In addition, the two-transistor path for loading/outputting data consists of two N-channel MOS transistors in series, which typically do not effectively transfer voltage signals corresponding to the high logic level.

Furthermore, the programming transfer circuit is described including a three-state buffer controlled by a corresponding signal. The Applicant observes that the three-state buffer of the programming transfer circuit includes four transistors and this is contrary to the desire of saving occupied area. This is a substantial waste of occupied area considering that there is one programming transfer circuit for each sense and latch block, and that the number of sense and latch blocks in the memory is equal to the memory page size (typically ranging from 512 byte and 2 kbyte).

In view of the state of the art outlined in the foregoing, the Applicant has faced the problem of providing a fast page buffer, occupying a limited area and controllable in a simpler way.

SUMMARY

According to an aspect of the present invention, a page buffer includes a plurality of storage units, each storage unit including first and second latches that each include a first input/output terminal and a second input/output terminal; input switching means for loading into the latch the data bit to be written and to be temporarily stored in response to an input control signal corresponding to the data bit, the input switching means having an input terminal connected to the respective data line for receiving a set voltage provided therethrough, a first output terminal coupled to the first input/output terminal of the latch and a second output terminal coupled to the second input/output terminal, and a control terminal receiving the input control signal, the input switching means providing the set voltage to the first or second input/output terminal of the latch depending on the data bit to be written; and an output switch device for transferring onto the respective data line the read data bit temporarily stored into the latch in response to an output control signal, the output switch device having a first terminal coupled to one among the first and second input/output terminals of the latch, a second terminal connected to the respective data line and a control terminal receiving the output control signal.

The features and the advantages of the present invention will be made apparent by the following description of a preferred embodiment thereof, provided merely by way of non-limitative example, description that will be conducted making reference to the attached figures, in which:

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
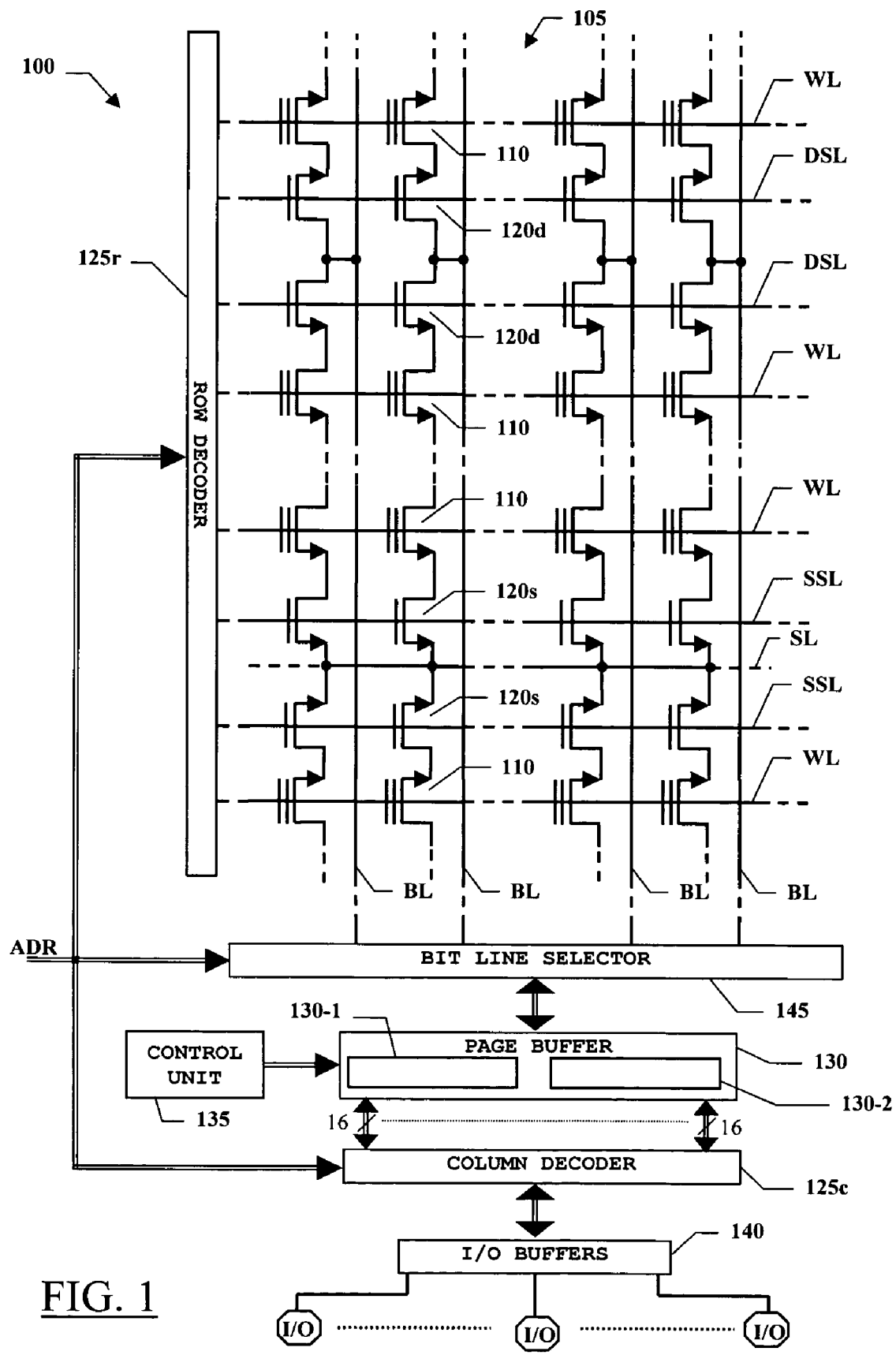
FIG. 1 schematically shows, in terms of the functional blocks of a NAND flash memory including a page buffer according to one embodiment of the present invention.

With reference to the drawings, in FIG. 1 a non-volatile semiconductor memory, globally identified as 100, is illustrated, particularly an electrically-programmable, non-volatile semiconductor memory, for example a flash memory.

The flash memory 100 is integrated in a chip of semiconductor material, and includes a matrix 105 of memory cells 110, arranged in a plurality of rows and a plurality of columns.

Typically, each memory cell 110 consists of an N-channel MOS transistor having a charge-storage element, such as a conductive floating gate adapted to be charged by injected electrons. Without entering into excessive details, well known to those skilled in the art, in an erased condition (associated by convention with a logic value "1"), the memory cell 110 has a low threshold voltage value. The memory cell 110 is programmed by injecting electric charges into its floating gate: in the programmed condition (associated by convention with a logic value "0"), the memory cell 110 has a high threshold voltage value. Therefore, when a selected memory cell 110 is biased for reading its content, the memory cell 110 will be conductive if erased or non-conductive if programmed.

The flash memory 100 has a so-called NAND architecture: in the matrix 105, groups of, e.g., eight, sixteen or even more (e.g., thirty-two) memory cells 110 are connected in series to each other to form a respective memory cells string, and different memory cells strings belonging to a same matrix column are connected in parallel to each other to a same bit line BL.

The memory cells 110 of a generic string are in particular connected in series between a source select N-channel MOS transistor 120s and a drain select N-channel MOS transistor 120d. A generic, intermediate memory cell 110 in the memory cells string has the drain terminal connected to the source terminal of an adjacent memory cell 110, and the source terminal connected to the drain terminal of another adjacent memory cell 110. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the other end memory cell 110 of the string has the source terminal connected to the drain terminal of the source select transistor 120s; the source terminal of the source select transistor 120s is connected to the source terminal of the corresponding source select transistor 120s of another adjacent memory cells string.

The control gate terminals of the memory cells 110 in each row are connected to a corresponding word line WL. The gate terminals of the drain select transistors 120d belonging to a common row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a common column of the matrix 105 are connected to a corresponding bit line BL. Conversely, the source terminals of all the source select transistors 120s in the matrix 105 are connected to a common source line SL (which is typically kept at a reference voltage, or ground).

The memory cells 110 belonging to the same row are logically partitioned into memory pages. Assuming, merely by way of example, that the matrix 105 includes 8192 bit lines BL, two memory pages of 512 Bytes each for each word line WL are defined, a first page consisting for example of the memory cells 110 in an even position, and a second page consists of the memory cells 110 in an odd position; thus, if, still by way of example, the matrix 105 includes 2048 word lines WL, the memory 100 has a total of 4096 memory pages of 512 Bytes each. It is pointed out that the number of bit lines and word lines as well as the size of the memory page, may greatly vary, not being a limitation for embodiments of the present invention. In particular, the number of memory pages that are associated with a generic word line may be higher than two, particularly multiples of two, such as four, eight and so on.

The flash memory 100 receives an address code ADR for selecting a desired memory page. A portion of the address code ADR is supplied to a row decoder 125r, which selects the desired word line WL, as well as the corresponding drain select line DSL and the corresponding source select line SSL. Another portion of the address code ADR is supplied to a column decoder 125c; the column decoder 125c connects I/O buffers 140, which are in turn associated with I/O terminals I/O of the flash memory 100, to a page buffer 130.

As will be described in greater detail in the following, the page buffer 130 is exploited as a temporary storage during read/write operations on the memory cells 110 of the selected page. The page buffer 130 has a storage capability at least equal to the storage capability of a memory page (for example, of 512 Bytes). For fitting an internal data parallelism of the flash memory 100 with a maximum external data parallelism, depending on a number p of the I/O terminals I/O (for example, eight or sixteen), the column decoder 125c provides to the page buffer 130 a data word to be written, or provides to the I/O terminals I/O a data word read, in chunks of p data bits at a time. Particularly, according to the decoding of the received portion of the address code ADR, the column decoder 125c connects desired portions of the page buffer 130 with the I/O terminals I/O.

The operation of the flash memory 100 is generally managed by a control unit, schematized as a block identified as 135, for example a microcontroller.

A memory page is selected by selecting a given word line WL, and a packet of bit lines BL; for example, if two memory pages of 512 Bytes each exist for each word line, one page corresponding to the memory cells in even position and the other page to the memory cells in odd position, the packet of selected bit lines BL includes the 4096 bit lines in even position or the 4096 bit lines in odd position. The selection of the word line WL is directly performed by the row decoder 125r, while the selection of the packet of bit lines BL is performed by a bit line selector 145 between the matrix 105 and the page buffer 130. According to the decoding of a respective portion of the address code ADR, the bit line selector 145 selects the desired packet of the bit lines and connects them to the page buffer 130.

During a read operation (PAGE READ), a data word (consisting of, e.g., 512 Bytes) stored in the selected memory page is read out and latched into the page buffer 130. The data word, temporarily stored in the page buffer 130, is then serially outputted through the I/O terminals I/O in chunks of, e.g., eight or sixteen bits by means of the column decoder 125c.

In greater detail, in order to access a given memory cell 110 for reading the content thereof, the drain select transistor 120d and the source select transistor 120s in the memory cells string to which the cell belongs are turned on, by asserting the drain select line DSL and the source select line SSL (for example, these two lines are brought to a voltage equal to the supply voltage Vdd of the memory); the bit line BL to which there is connected the string of cells containing the memory cell to be read is selected by the bit line selector 145. The row decoder 125r biases the word line WL to which the selected memory cell belongs to a voltage intermediate between the erased threshold voltage value and the programmed threshold voltage value (e.g., the ground); the remaining word lines WL controlling the gates of the other memory cells of the same string are all brought to a potential sufficiently high to ensure that these memory cells are turned on irrespective of their programming state (for example, a voltage of approximately 4.5 V). All the other word lines WL (associated with different memory cells strings) are for example kept grounded.

During a write operation (PAGE PROGRAM), a data word to be written, received from outside the memory through the I/O terminals I/O, is loaded into the page buffer 130. The data word to be written is received serially in, e.g., eight- or sixteen-bits chunks, and the page buffer 130 is thus replenished with data in a sequence of steps; when the buffer has eventually been filled, the data are written in parallel into the memory cells of a given selected page.

In order to access a given memory cell 110 for programming it, the drain select transistor 120d in the memory cells string to which the cell belongs is turned on by asserting the drain select line DSL (for example, bringing this line to the supply voltage Vdd), whereas the source select transistor 120s is kept off by keeping the source select line SSL deasserted (e.g., grounded); the bit line BL to which there is connected the string of cells containing the memory cell to be programmed is selected by the bit line selector 145. The row decoder 125r biases the word line WL to which the selected memory cell belongs to a high programming voltage, e.g. 20 V; the remaining word lines WL controlling the gates of the other memory cells of the same string are all brought to a potential (e.g., approximately 10 V) sufficiently high to ensure that these memory cells are turned on irrespective of their programming state, but sufficiently lower than the programming voltage not to cause spurious programming. All the other word lines WL (associated with different memory cells strings) are for example kept grounded. In order to program the selected memory cell, the bit line BL is kept grounded, so that the drain select transistor 120d is surely kept on; the ground voltage at the bit line, propagating through the drain select transistor and the channel of the memory cells in the string, reaches the channel of the memory cell to be programmed; here, the voltage difference of approximately 20 V between the control gate and the channel experienced by the selected memory cell is sufficient to cause electron tunneling into the floating gate. On the contrary, if the bit line is biased at a higher potential, for example equal to the supply voltage (Vdd, e.g. 3 V), like the drain select line DSL, the drain select transistor 120d turns off as soon as the voltage of the memory cells string rises (due to the capacitive coupling) following the voltage applied to the word lines; the channels of the memory cells of the selected memory cells string thus remain floating, and the string channel voltage rises to a value such that the control gate-to-channel voltage difference at the selected memory cell is not sufficient to cause significant electron tunneling, and the memory cell is not programmed. In this way, by applying to the selected bit lines the proper voltage, the cells 110 of the selected page to be brought to the logic value "0" are then programmed, while the other cells 110 are left unchanged.

Figure 2:
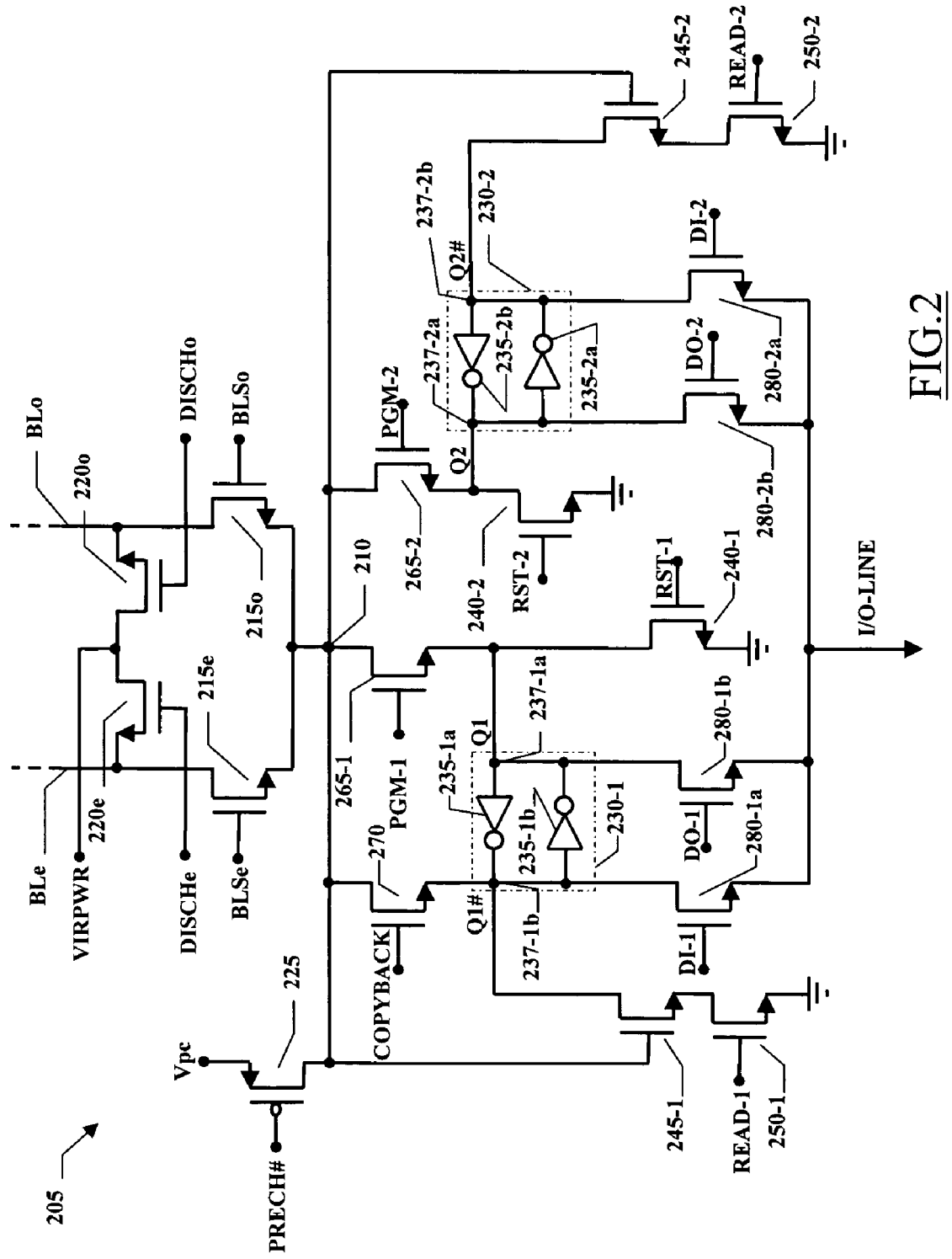
FIG. 2 is a circuit schematic of a page buffer of the memory of FIG. 1, according to an embodiment of the present invention.

In FIG. 2 the circuit structure of the page buffer 130 is shown, according to an embodiment of the present invention.

In particular, in the exemplary invention embodiment herein described, it is assumed that the page buffer 130 is adapted to implement operations more complex than a simple PAGE READ and a simple PAGE PROGRAM; in particular, it is assumed that the page buffer 130 is adapted to implement operations such as a CACHE READ operation, a CACHE PROGRAM operation and a COPY-BACK PROGRAM operation. The page buffer 130 thus includes a both and a second register 130-2, both visible in FIG. 1, each of the registers 130-1, 130-2 including a number of latches corresponding to, in particular equal to, the size (number of bits) of the memory page. FIG. 2 depicts a circuit structure of a page buffer unit, including one such latch of the register 130-1, the corresponding latch of the register 130-2, and shows the way these two latches are operatively coupled to one another.

The page buffer 130 includes a read/write unit 205 for each pair of adjacent bit lines (more generally, for each packet of bit lines associated with the page buffer unit). Particularly, an even bit line BLe and an odd bit line BLo are connected to a common node 210 through respective N-channel MOS transistors 215e and 215o, included in the bit line selector 145. The transistors 215e and 215o have the respective drain terminal connected to the corresponding bit lines BLe, BLo, and the source terminals connected to the common node 210; the gate terminals of the transistors 215e and 215o are controlled by respective select signals BLSe and BLSo, respectively. Two N-channel MOS transistors 220e and 220o are also provided in the bit line selector 145, each one for precharging/discharging the respective bit line BLe and BLo to a predefined biasing voltage VIRPWR (such a precharge/discharge operation is preferably performed before any read/write operation). For this purpose, the transistors 220e and 220o have the source terminals connected to the corresponding bit lines BLe, BLo; the drain terminals of the transistors 220e and 220o are connected together to a terminal providing the biasing voltage VIRPWR. The gate terminals of the transistors 220e, 220o are controlled by respective precharge/discharge signals DISCHe, DISCHo.

A P-channel MOS transistor 225 is used for precharging the node 210 at the beginning of the generic read/write operation. For this purpose, the transistor 225 has the drain terminal connected to the node 210, the source terminal connected to a terminal providing a pre-charge voltage Vpc, and the gate terminal controlled by a pre-charge signal PRECH# (the suffix # being used to indicate that the signal is asserted at the logic value "0"—corresponding to the ground potential—and is deasserted at the logic value "1"—corresponding to the supply voltage Vdd). It is pointed out that although in some invention embodiments the signal PRECH# is a digital signal, nothing prevents from using an analog signal, taking any value between ground and the supply voltage Vdd.

The read/write unit 205 includes a first latch 230-1 (one of the latches making up the first register 130-1) and a second latch 230-2 (the corresponding latch of the second register 130-2).

The first latch 230-1 is formed by two inverters 235-1a and 235-1b, connected in a loop with the input terminal of the inverter 235-1a connected to the output terminal of the inverter 235-1b so as to define a node 237-1a, providing a signal Q1, and the output terminal of the inverter 235-1a connected to the input terminal of the inverter 235-1b so as to define a node 237-1b, providing a signal Q1# that is the logic complement of the signal Q1.

An N-channel MOS transistor 240-1 is used to reset the first latch 230-1. For this purpose, the transistor 240-1 has the drain terminal connected to the node 237-1a, the source terminal connected to ground and the gate terminal controlled by a first latch reset signal RST-1. The first latch 230-1 is set by means of two N-channel MOS transistors 245-1 and 250-1 that are connected in series: the transistor 245-1 has the drain terminal connected to the node 237-1b and the source terminal connected to the drain terminal of the transistor 250-1; the source terminal of the transistor 250-1 is connected to ground. The gate terminal of the transistor 245-1 is controlled by the voltage at the node 210, whereas the gate terminal of the transistor 250-1 is controlled by a first latching or read signal READ-1.

An N-channel MOS transistor 265-1 is used to couple the node 237-1a to the node 210, thus to the selected bit line BLe or BLo, in order to program the selected memory cell 110 during a write operation. For this purpose, the transistor 265-1 has the drain terminal connected to the node 210 and the source terminal connected to the node 237-1a; the gate terminal of the transistor 265-1 is controlled by a first programming signal PGM-1.

A further N-channel MOS transistor 270 is used to couple the node 237-1b to the node 210, thus to the selected bit line BLe or BLo, in order to program the selected memory cell 110 during a COPY-BACK PROGRAM operation (as described in greater detail in the following). For this purpose, the transistor 270 has the drain terminal connected to the node 210 and the source terminal connected to the node 237-1b; the gate terminal of the transistor 270 is controlled by a copy-back programming signal COPYBACK.

N-channel MOS transistors 280-1a and 280-1b are used to load a data bit to be written into the first latch 230-1 during an input phase, at the beginning of a write operation. For this purpose, the transistors 280-1a and 280-1b have respective drain terminals connected to the nodes 237-1b and 237-1a. The source terminals of the transistors 280-1a and 280-1b are connected together to an I/O data line I/O-LINE in turn connected to the column decoder 125c. The gate terminal of the transistor 280-1a receives a first input signal DI-1 (whose logic state represents the target value to be loaded into the first latch 230-1) and the gate terminal of the transistor 280-1b receives a first output signal DO-1 (which is the logic complement of the first input signal DI-1). At the beginning of the write operation, the I/O data line I/O-LINE is kept grounded (for example, by means of a MOS transistor, not shown, activated so as to tie the I/O data line I/O-LINE to the ground line). The transistor 280-1b is further used at the end of a read operation to provide the read data bit, loaded into the first latch 230-1, to the I/O data line I/O-LINE.

The second latch 230-2 is formed by two inverters 235-2a and 235-2b connected in a loop: the input terminal of the inverter 235-2a is connected to the output terminal of the inverter 235-2b to define a node 237-2a, providing a signal Q2; likewise, the output terminal of the inverter 235-2a is connected to the input terminal of the inverter 235-2b to define a node 237-2b, which provides a signal Q2# being the logic complement of the signal Q2.

An N-channel MOS transistor 240-2 is used to reset the second latch 230-2. For this purpose, the transistor 240-2 has the drain terminal connected to the node 237-2a, the source terminal connected to ground and the gate terminal controlled by a second reset signal RST-2. The second latch 230-2 is set by means of two N-channel MOS transistors 245-2 and 250-2 that are connected in series. Particularly, the transistor 245-2 has the drain terminal connected to the node 237-2b and the source terminal connected to the drain terminal of the transistor 250-2; the source terminal of the transistor 250-2 is connected to ground. The gate terminal of the transistor 245-2 is controlled by the voltage at the node 210, while the gate terminal of the transistor 250-2 is controlled by a second latching or read signal READ-2.

An N-channel MOS transistor 265-2 is used to couple the node 237-2a to the node 210, thus to the selected bit line BLe or BLo, in order to program the selected memory cell 110 during a write operation. For this purpose, the transistor 265-2 has the drain terminal connected to the node 210 and the source terminal connected to the node 237-2a; the gate terminal of the transistor 265-2 is controlled by a second programming signal PGM-2.

N-channel MOS transistors 280-2a and 280-2b are used to load a data bit to be written into the second latch 230-2 during an input phase, at the beginning of a write operation. For this purpose, the transistor 280-2a has the drain terminal connected to the node 237-2b and the transistor 280-2b has the drain terminal connected to the node 237-2a. The transistors 280-2a and 280-2b have respective source terminals connected together to the I/O data line I/O-LINE. The gate terminal of the transistor 280-2a receives a second input signal DI-2 (whose logic state represents the target value to be loaded into the second latch 230-2) and the gate terminal of the transistor 280-2b receives a second input signal DO-2 (which is the logic complement of the second input signal DO-2). The MOS transistor 280-2b is further used at the end of a read operation to provide the read data bit, loaded into the second latch 230-2, to the I/O data line I/O-LINE.

It can be observed that the read/write unit 205 is symmetrical, except for the transistor 270 connecting the node 210 and the node 237-1b of the first latch 230-1. Accordingly, the first and second latches 230-1 and 230-2 are controlled by equivalent signals, except for the copy-back programming signal COPYBACK controlling the first latch 230-1; thus, any one of the first and second latches 230-1 and 230-2 can be exploited for performing the same operations on the memory cells, exception made for the COPY-BACK PROGRAM operation.

However, a further transistor (and a related control signal) might be provided connecting the node 210 and the node 237-2b of the second latch 230-2, thus permitting performance of the COPY-BACK PROGRAM operation also by means of the second latch 230-2.

The operations that can be performed on the flash memory 100 are described in the following with reference to FIGS. 1 and 2.

Before any read/write operation on a selected bit line BL, such as the bit line BLe (similar considerations apply to the other bit line BLo), the corresponding precharge/discharge signal DISCHe is asserted; as a consequence, the transistor 220e turns on, so as to apply the biasing voltage VIRPWR to the selected bit line BLe.

A PAGE READ operation begins with an evaluation phase. First, the desired bit line BLe is selected by the bit line selector 145, i.e. connected to the common node 210 through the transistor 215e turned on by bringing the select signal BLSe to a first appropriate voltage (e.g. 2V), and the node 210 is precharged by the transistor 225 to a proper initial voltage value (e.g. 1V) taken by the pre-charge voltage Vpc. The other bit line BLo, not selected (transistor 215o off) is discharged (through the transistor 220o) to the voltage VIRPWR, preferably to ground (so as to limit the capacitive coupling).

Successively, the transistor 215e is turned off (by bringing the selection signal BLSe to the ground voltage) and, as mentioned in the foregoing, the drain select transistor 120d and the source select transistor 120s are turned on by the row decoder 125r, by asserting the drain select line DSL and the source select line SSL; furthermore, the row decoder 125r biases the word line WL to which the selected memory cell 110 belongs to a voltage intermediate between the erased memory cell threshold voltage value and the programmed memory cell threshold voltage value. The remaining word lines controlling the gates of the other memory cells 110 of the same string are all brought to a potential sufficiently high to ensure that such memory cells are turned on irrespective of their programming state.

Then, the transistor 215e is again turned on by bringing the selection signal BLSe to a second appropriate voltage (e.g. 1.4V), preferably lower than the first voltage for a better discrimination of the logic value to be read. If the accessed memory cell is erased, the potential of the bit line BLe, and thus that of the node 210, falls to ground, whereas, if the memory cell is programmed, the potential of the bit line BLe, and that of the node 210, remains at the precharge potential.

The first latch 230-1 is reset by asserting the first reset signal RST-1, thereby turning the transistor 240-1 on; in this way, the node 237-1a is brought to ground and the signal Q1 initially takes the logic value "0".

Then, the potential at the node 210 is sensed by asserting the first read signal READ-1, thereby turning the transistor 250-1 on: the logic state corresponding to the potential at the node 210 is thus loaded into the first latch 230-1.

Finally, the first output signal DO-1 is asserted and the transistor 280-1b is turned on, so that the logic state latched in the first latch 230-1 is brought onto the I/O data line I/O-LINE. In this way, the read data bit is transferred to the I/O buffers 140, and then to one of the I/O terminals I/O.

Alternatively, the PAGE READ operation can be performed by exploiting the second latch 230-2, which is reset by asserting the second reset signal RST-2 and loaded by asserting the second read signal READ-2 (thereby turning the transistor 250-2 on). The logic state latched in the second latch 230-2 is brought onto the I/O data line I/O-LINE by asserting the second output signal DO-2.

In a PAGE PROGRAM operation, the two bit lines BLe and BLo are preliminarily precharged to a same, program inhibition voltage, e.g. 3 V.

The target data bit to be written into the selected memory cell 110 is loaded into, for example, the first latch 230-1. To this purpose, the I/O data line I/O-LINE (and thus the source terminals of the transistors 280-1*a* and 280-1*b*) is kept grounded. The target data bit (represented by the first input signal DI-1) is then applied to the gate terminal of the transistor 280-1*a*. Therefore, if the target data bit is "1", the transistor 280-1*a* turns on (and the transistor 280-1*b* is kept off), so as to bring the node 237-1*b* to ground; in this way, the signal Q1# is brought to the logic value "0" and the signal Q1 is brought to the logic value "1". Conversely, if the target data bit is "0", the transistor 280-1*b* turns on (and the transistor 280-1*a* is kept off), so as to bring the node 237-1*a* to ground; in this way, the signal Q1 takes the logic value "0" and the signal Q1# takes the logic value "1".

By asserting the first programming signal PGM-1, the transistor 265-1 is turned on and the selected bit line Ble reaches the proper voltage depending on the logic value at the node 237-1*a*. In this way, when the selected memory cell is to be programmed (signal Q1 at the logic value "0"), the potential of the selected bit line BLe is brought to ground, and the selected memory cell is thus biased in a condition favorable to cause tunneling of electric charges into its floating gate.

A program verify phase may follow the programming phase.

Analogously to the PAGE READ operation, also the PAGE PROGRAM operation can be alternatively performed by exploiting the second latch 230-2 and the related signals DO-2 and PGM-2.

Another operation that can be performed by the page buffer 140 herein described is the CACHE PROGRAM. In this case, similarly to the previously described PAGE PROGRAM operation, the target data bit to be written into the selected memory cell is firstly loaded, for example, into the first latch 230-1, from which the data bit is then applied to the selected bit line. It can be appreciated that, during this operation, the second latch 230-2 is available, and that it can be used to load another data bit, corresponding to another memory page to be written, even if the programming of the previous data bit is still going on. In practice, while the first latch 230-1 applies (through the transistor 265-1) the data bit to be programmed to the node 210, the second latch 230-2, isolated from the node 210 by the fact that the transistor 265-2 is off, can receive and store a new data bit, in the same way described above.

A further operation that can be implemented using the page buffer 140 described herein is the COPY-BACK PROGRAM operation, used to copy the content of a selected memory page into another selected memory page, in a way totally transparent to the outside world and without the need of outputting and re-inputting data. In the exemplary and non-limitative embodiment herein described, only the first latch 230-1 is adapted to perform a COPY-BACK PROGRAM operation, being provided with the transistor 270 controlled by the appropriate copy-back programming signal COPYBACK. A selected memory cell 110 is accessed, and the content thereof is read as in the previously described PAGE READ operation. The logic state corresponding to the potential developing at the node 210 is loaded into the first latch 230-1 by asserting the first reading signal READ-1. Accordingly, the signal Q1# at the node 237-1*b* takes the logic value of the read data bit. Finally, the data bit stored in the first latch 230-1 is applied to the selected bit line by asserting the copy-back programming signal COPYBACK, after having preliminarily precharged the two bit lines BLe and BLo to the program inhibition voltage. According to the assertion of the copy-back programming signal COPYBACK, the transistor 270 turns on and the node 210 reaches the potential corresponding to the logic state to be programmed in another selected memory cell 110. Alternatively, only the second latch 230-2 may be adapted to perform the COPY-BACK PROGRAM operation by providing the transistor 270 connected between the node 210 and the node Q2# in place of the node Q1#. Furthermore, a transistor can be provided for both the first and second latches 230-1 and 230-2.

A still further operation that can be implemented using the page buffer 140, according to the embodiment of the present invention herein described, is the CACHE READ operation. Analogously to the previously described CACHE PROGRAM operation, the data bit read from the selected memory cell is firstly loaded, for example, into the first latch 230-1, for being outputted towards the I/O data line I/O-LINE. During the transfer of the first read data bit, the second latch 230-2 is available and can be used to read a second data bit, corresponding to another memory page to be read. In practice, two PAGE READ operations are performed in a concatenated way: while the first latch 230-1 reads and loads (through the transistors 245-1 and 250-1) the first data bit from the node 210, the second latch 230-2 is isolated from the node 210 by the fact that the transistors 245-2 and 250-2 are off. Successively, while the first latch 230-1 outputs the first read data bit, being isolated from the node 210 by switching the transistors 245-1 and 250-1 off, the second latch 230-2 receives and stores the second data bit, in the same way described above.

The plurality of operations described above is merely exemplary, but not limitative, with other operations being possible.

Expediently, the provision of the above-described symmetrical structure allows avoiding the transfer of a data bit from one latch to the other latch in any operation. Accordingly, the operations on the flash memory are greatly speeded up, since an initial latency, i.e., a time interval between a first time at which a first address is provided to the memory and a second time in which the first data read is available at the output, is reduced. Particularly, considering the cache operations, an intermediate latency between a read/write operation on a page and a successive read/write operation on another page is substantially eliminated.

This result is obtained by exploiting a limited number of transistors, saving an occupied area on the respective chip. In fact, the programming function is performed by means of a single transistor with a single appropriate control signal in any case. Furthermore, the loading of a target data bit is performed only by means of a pair of transistors connected between the I/O data line and the respective latch nodes; accordingly, for the data bit loading only one control signal (with its logic complement) is required. Similarly, the outputting of a read data bit is obtained by means of one transistor (connected between the I/O data line and one of the latch nodes) and the respective control signal, further avoiding the problem of an effective transfer of voltage signals corresponding to the high logic value. In addition, it has to be observed that also the resetting of the latches is easily performed by means of a single transistor controlled by a single control signal. As a consequence, a limited number of control signals is used for managing the operations on the memory, advantageously simplifying and rendering less critical their control.

Although in the foregoing reference has been made to a page buffer including two registers, namely a first register and a second register, this is not to be intended as a limitation of the present invention, which can as well be applied in case the page buffer includes more than two registers, and, particularly, more than one pair of registers.

Although the present invention has been disclosed and described by way of an embodiment, it is apparent to those skilled in the art that modifications to the described embodiment, as well as other embodiments of the present invention are possible without departing from the scope thereof as defined in the appended claims.

The invention claimed is:

1. A page buffer for an electrically programmable memory including a plurality of memory cells forming a plurality of memory pages, the page buffer comprising a plurality of storage units for at least temporarily storing data read from or to be written into the memory cells of selected memory pages of said plurality, each storage unit comprising a first latch and a second latch, operative with a selected bit line of memory cells and with a respective data line to an output interface of the memory, wherein each of said first and second latches includes:

a first latch input/output terminal connected to a first terminal of a first switch device having a control terminal to receive an input control signal corresponding to a data bit to be written; and a second latch input/output terminal connected to a first terminal of a second switch device having a control terminal to receive a signal corresponding to a logic complement of the input control signal, wherein the first and second switch devices each have a second terminal connected to the respective data line for transferring a set voltage provided therethrough to the first or second latch input/output terminal depending on the data bit to be written into the latch in response to the input control signal and wherein one of the first and second switch devices is further configured to transfer onto the respective data line a read data bit from the latch in response to an output control signal received by the control terminal.

2. The page buffer according to claim 1, in which each of said first and second latches includes a reset switch device for resetting the latch in response to a reset control signal, said reset switch device having a first terminal coupled to one of the first and second input/output terminals of the latch, a second terminal receiving a reset voltage and a control terminal receiving the reset control signal.

3. The page buffer according to claim 1, in which each of the first and second latches includes a program switch device for driving the selected bit line according to the data bit to be written into the selected memory cell in response to a program control signal, the program switch device having a first terminal coupled to the second input/output terminal of the latch, a second terminal coupled to the selected bit line and a control terminal receiving the program control signal.

4. The page buffer according to claim 1, in which at least one among the first and second latches includes a copy-back program switch device for driving the selected bit line according to the data bit stored therein and read from a memory cell belonging to another bit line in response to a copy-back program control signal, the copy-back program switch device having a first terminal couple to the first input/output terminal of the latch, a second terminal coupled to the selected bit line and a control terminal receiving the copy-back program control signal.

5. The page buffer according to claim 1, in which each one of said first and second latches includes a first and a second inverters connected in a loop.

6. The page buffer according to claim 1, in which one of said first and second latches is adapted to program the selected memory cell of a first memory page with a first data bit preliminary loaded therein, while the other of said second and first latches loads a second data bit to be successively written into the selected memory cell of a second memory page.

7. The page buffer according to claim 1, in which one of said first and second latches is adapted to output a first data bit, preliminary read from the selected memory cell of a first memory page, while the other of said first and second latches reads a second data bit from the selected memory cell of a second memory page.

8. An electrically programmable memory including:

a plurality of memory cells forming a plurality of memory pages; and a page buffer comprising a plurality of storage units for at least temporarily storing data read from or to be written into the memory cells of selected memory pages of said plurality, each storage unit comprising a first latch and a second latch, operative with a selected bit line of memory cells and with a respective data line to an output interface of the memory, wherein each of said first and second latches includes:

a first latch input/output terminal connected to a first terminal of a first switch device having a control terminal to receive an input control signal corresponding to a data bit to be written; and a second latch input/output terminal connected to a first terminal of a second switch device having a control terminal to receive a signal corresponding to a logic complement of the input control signal, wherein the first and second switch devices each have a second terminal connected to the respective data line for transferring a set voltage provided therethrough to the first or second latch input/output terminal depending on the data bit to be written into the latch in response to the input control signal and wherein one of the first and second switch devices is further configured to transfer onto the respective data line a read data bit from the latch in response to an output control signal received by the control terminal.

9. A page buffer storage circuit including at least two latches, each latch having a first input/output node coupled to a data line through an input/output switch adapted to receive an input control signal corresponding to a data bit to be written, the input/output switch further adapted to receive an output control signal and each latch having a second input/output node coupled to the data line through an input switch adapted to receive a signal corresponding to a logic complement of the input control signal, the input/output switch being operable responsive to the input control signal to transfer a data signal applied on the data line into the latch through a data input path and the latch operable to store the data signal, with the stored data signal corresponding to a data bit being written to one of a plurality of memory cells associated with bit line, and the input/output switch being further operable responsive to the output control signal to transfer a data signal stored in the latch onto the data line through a data output path, with the data signal stored in the latch corresponding to a data bit being read from one of the plurality of memory cells associated with the bit line, and wherein the data input and output paths each include a single switching element between each of the first and second input/output nodes and the data line.

10. The page buffer storage circuit of claim 9 wherein the single switching element in the data input path receives the input control signal on a control node and the single switching element in the data output path receives the output control signal.

11. The page buffer storage circuit of claim 10 wherein the single switching element in the data input path has signal nodes coupled between a storage node in the latch and the data line and wherein the single switching element in the data output path has signal nodes coupled between a complementary storage node in the latch and the data line.

12. The page buffer storage circuit of claim 11 and wherein the data input path includes paths from the data line through each of the switching elements to the corresponding storage nodes in the latch, and wherein the output control signal is the complement of the input control signal when data is being applied through the data input path and stored in the latch and wherein the input control signal has a value corresponding to the logic state of data being stored in the latch and data corresponding to a certain logic state is applied on the data line.

13. The page buffer storage circuit of claim 10 wherein each switching element comprises an NMOS transistor.

14. The page buffer storage circuit of claim 9 wherein each latch comprises a pair of cross-coupled inverters.

15. The page buffer storage circuit of claim 9 further comprising a copyback switching element coupled between the input/output node and a storage node in the latch, the copyback switching element including a control node adapted to receive a copyback signal and the copyback switching element operable to transfer a data signal stored in the latch from a first memory cell onto the input/output node for storage via the bit line into a second memory cell.

16. The page buffer storage circuit of claim 15 further comprising a programming switching element coupled between the input/output node and a complementary storage node in the latch, the programming switching element including a control node adapted to receive a programming signal and being operable to transfer a data signal stored in the latch onto the input/output node and into a memory cell via the it line.

17. A memory device, comprising:
a memory-cell array including a plurality of memory cells, each memory cell being coupled to an associated bit line and an associated word line;
a row address decoder coupled to an address bus and to the word lines, the row address decoder adapted to receive an address on the address bus and operable to decode a row portion of the address and activate a selected word line responsive to decoded row portion;
a bit line selector circuit coupled to the bit lines, the selection circuit operable to select bit lines responsive to the address on the address bus and operable to couple each selected bit line to an associated input/output node;
a page buffer including first and second registers, each register including a plurality of a plurality of storage units operable to store data being read from or to be written into memory cells in the array, each storage unit comprising at least two latches and each latch having a first input/output node coupled to a data line through an input/output switch adapted to receive an input control signal corresponding to a data bit to be written, the input/output switch further adapted to receive an output control signal, and each latch having a second input/output node coupled to the data line through an input switch adapted to receive a signal corresponding to a logic complement of the input control signal, the input/output switch being operable responsive to the input control signal to transfer a data signal applied on the data line into the latch through a data input path and the latch operable to store the data signal, with the stored data signal corresponding to a data bit being written to one of a plurality of memory cells associated with bit line, and the input/output switch being further operable responsive to the output control signal to transfer a data signal stored in the latch onto the data line through a data output path, with the data signal stored in the latch corresponding to a data bit being read from one of the plurality of memory cells associated with the bit line, and wherein the data input and output paths each include a single switching element between each of the first and second input/output nodes and the data line; and
a column address decoder coupled to the data lines of the latches and coupled to input/output lines of the memory device, the column address decoder operable to decode a column portion of the address of the address on the address bus and to couple selected data lines to input/output lines responsive to the decoded column portion.

18. The memory device of claim 17 wherein the memory-cell array comprises a plurality of nonvolatile memory cells.

19. The memory device of claim 17 wherein each of the nonvolatile memory cells comprises a FLASH memory cell.

20. An electronic system including a memory device, the memory device comprising:
a memory-cell array including a plurality of memory cells, each memory cell being coupled to an associated bit line and an associated word line;
a row address decoder coupled to an address bus and to the word lines, the row address decoder adapted to receive an address on the address bus and operable to decode a row portion of the address and activate a selected word line responsive to decoded row portion;
a bit line selector circuit coupled to the bit lines, the selection circuit operable to select bit lines responsive to the address on the address bus and operable to couple each selected bit line to an associated input/output node;
a page buffer including first and second registers, each register including a plurality of a plurality of storage units operable to store data being read from or to be written into memory cells in the array, each storage unit comprising at least two latches and each latch having a first input/output node coupled to a data line through an input/output switch adapted to receive an input control signal corresponding to a data bit to be written, the input/output switch further adapted to receive an output control signal, and each latch having a second input/output node coupled to the data line through an input switch adapted to receive a signal corresponding to a logic complement of the input control signal, the input/output switch being operable responsive to the input control signal to transfer a data signal applied on the data line into the latch through a data input path and the latch operable to store the data signal, with the stored data signal corresponding to a data bit being written to one of a plurality of memory cells associated with bit line, and the input/output switch being further operable responsive to the output control signal to transfer a data signal stored in the latch onto the data line through a data output path, with the data signal stored in the latch corresponding to a data bit being read from one of the plurality of memory cells associated with the bit line, and wherein the data input and output paths each include a single switching element between each of the first and second input/output nodes and the data line; and
a column address decoder coupled to the data lines of the latches and coupled to input/output lines of the memory device, the column address decoder operable to decode a column portion of the address of the address on the address bus and to couple selected data lines to input/output lines responsive to the decoded column portion.

21. The electronic system of claim 20 wherein the electronic system comprises a computer system.

22. A method of transferring data to and from memory-cells contained in a memory-cell array, the memory-cell array including a plurality of memory-cells, each memory cell being coupled to an associated bit line in the array, the method comprising:
within a series of clock cycles,
receiving a first data signal to be written into a first memory cell onto a data line;
transferring the first data signal from the data line through a low-voltage-loss data input path to a first or second input/output terminal of one a first or second latch, wherein the low-voltage-loss data input path to either of the first or second latch depends on the value of a data bit to be written and includes voltage losses of no more than a single threshold voltage;
transferring the first data signal from the first latch to the first selected memory cell via the bit line associated with the first memory cell; and,
within a series of clock cycles,
placing a second data signal from a second memory cell onto the bit line associated with the second memory cell;
storing the second data signal in the other of the first and second latch; and
transferring the data signal through a low-voltage-loss data output path and onto the data line, wherein the low-voltage-loss data input path includes voltage losses of no more than a single threshold voltage.

23. The method of claim 22 wherein the first and second data signals are the same data signal, and wherein the first and second memory cells are the same memory cell.

* * * * *